United States Patent [19]
Cheung et al.

[11] Patent Number: 5,929,658
[45] Date of Patent: Jul. 27, 1999

[54] CURRENT-MODE SENSE AMPLIFIER

[75] Inventors: Chu-Ming Cheung, Singapore, Singapore; Xaver Meindl, Bad Aibling, Germany

[73] Assignee: Siemens Aktiengesellschaft, Munich, Germany

[21] Appl. No.: 08/921,818

[22] Filed: Sep. 2, 1997

[30] Foreign Application Priority Data

Sep. 2, 1996 [EP] European Pat. Off. ............ 96 114 022

[51] Int. Cl.$^6$ .................................................. G01R 19/00
[52] U.S. Cl. ................................. 327/53; 327/85; 327/538
[58] Field of Search .................................. 327/51, 53, 77, 327/78, 80, 85, 543, 538; 323/315

[56] References Cited

U.S. PATENT DOCUMENTS

| | | | |
|---|---|---|---|
| 5,056,063 | 10/1991 | Santin et al. ............................. | 365/208 |
| 5,111,069 | 5/1992 | Deierling ................................. | 307/303 |
| 5,138,201 | 8/1992 | Ohbayashi et al. ...................... | 307/530 |
| 5,206,552 | 4/1993 | Iwashita .................................. | 307/530 |
| 5,258,669 | 11/1993 | Nakashima .............................. | 307/530 |
| 5,341,333 | 8/1994 | Tien et al. ............................... | 365/189.06 |
| 5,343,086 | 8/1994 | Fung et al. .............................. | 307/296.1 |
| 5,512,852 | 4/1996 | Kowalski ................................. | 327/206 |
| 5,726,592 | 3/1998 | Schulte et al. ........................... | 327/65 |

FOREIGN PATENT DOCUMENTS

| | | |
|---|---|---|
| 0 420 189 A3 | 4/1991 | European Pat. Off. . |
| 43 26 133 A1 | 2/1994 | Germany . |

OTHER PUBLICATIONS

"A High Speed Clamped Bit–Line Current–Mode Sense Amplifier" (Blalock et al.), 8107 IEEE Journal of Solid–State Circuits, No. 4, Apr. 1991, pp. 542–548;.

"Current Mode Techniques for High–Speed VLSI Circuits with Application to Current Sense–Amplifier for CMOS SRAMs" (Seevinck et al.), 8107 IEEE Journal of Solid–State Circuits, No. 4, Apr. 1991, pp. 525–535;.

*Primary Examiner*—Terry D. Cunningham
*Assistant Examiner*—Maria Hasanzadah
*Attorney, Agent, or Firm*—Herbert L. Lerner; Laurence A. Greenberg

[57] ABSTRACT

A current-mode sense amplifier includes a current mirror circuit having an input branch controlled by a current input signal to be sensed and an output branch connected to a capacitor. The output branch and gates of current mirror transistors are connected to transistors for precharge operation. The sense amplifier needs no reference current, provides a low component count and is noise resistant.

5 Claims, 1 Drawing Sheet

CURRENT-MODE SENSE AMPLIFIER

BACKGROUND OF THE INVENTION

FIELD OF THE INVENTION

The invention relates to a current amplifier and particularly to a current-mode sense amplifier for sensing the bitline of a memory.

In semiconductor memories the information stored in a memory cell has to be sensed and amplified for reading. A number of memory cells is connected to a bitline whereby a particular cell is selected for reading through a wordline. A sense amplifier connected to the bitline detects and amplifies the information stored in the selected memory cell.

A current-mode sense amplifier for a CMOS memory cell is described in an article entitled "A High-Speed Clamped Bit-Line Current-Mode Sense Amplifier", by Travis N. Blalock et al. in IEEE Journal of Solid State Circuits, Vol. 26, No. 4, April 1991, pages 13 to 19. The known current-mode sense amplifier compares an input current from a memory cell with a reference current. The reference current is provided by a dummy memory cell producing a current that is between the currents representing digital logic states. Usually, the reference level is set at a mid-point between no data current and minimum data current. The current-mode sense amplifier detects a data input current above or below the reference current as the different digital logic states.

The known sense amplifier demands a high degree of layout symmetry between the sense amplifier transistor pairs, especially with respect to element orientation or dimensioning. The transistor count is rather high and needs much chip area. Its operation is very susceptible to cross talk effects. The structural layout of the amplifier itself and of the memory cell array must consider the crosstalk risk. The sense amplifier layout must be compact to avoid significant contribution on internal node capacitances by transistor interconnections.

The sense amplifier is highly sensitive leading to the disadvantage of being susceptible to noise and process variations due to the sensitive nodes of the amplifier and its high gain feedback loop. That may affect the current margin of the sense amplifier.

SUMMARY OF THE INVENTION

It is accordingly an object of the invention to provide a current-mode sense amplifier, which overcomes the hereinafore-mentioned disadvantages of the heretofore-known devices of this general type, which works in a more stable manner and which has a decreased expense for realization of the circuit.

With the foregoing and other objects in view there is provided, in accordance with the invention, a current amplifier, comprising a terminal for an input signal to be current amplified; first and second supply terminals; a current mirror circuit having an input or first branch with two ends, an output or second branch with two ends and a connection node between the branches; one of the ends of the input branch connected to the input signal terminal; another of the ends of the input branch connected to the first supply terminal; a first control transistor connected between one of the ends of the output branch and the second supply terminal; a capacitive device connected to the one end of the output branch; another of the ends of the output branch connected to the first supply terminal; and a second control transistor connected between the connection node and the first supply terminal; the control transistors controlled by a control signal for precharching the capacitive device prior to application of the input signal.

In accordance with another feature of the invention, the control signal for precharching the capacitive device is applied inverted to the first control transistor and non-inverted to the second control transistor.

In accordance with a further feature of the invention, the capacitive device is connected between the one end of the output branch of the current mirror circuit and the first supply terminal.

In accordance with an added feature of the invention, there is provided another connection node between the one end of the output branch of the current mirror circuit and the capacitive device, a gating device connected to the other connection node, and another amplifier device connected to the gating device.

In accordance with an additional feature of the invention, the gating device is a path transistor and the other amplifier device is an inverter.

In accordance with a concomitant feature of the invention, there is provided another transistor having a drain-source path, and an ohmic resistor, the input branch of the current mirror circuit having the drain-source path of the other transistor and the ohmic resistor, and the ohmic resistor connected between the drain-source path of the other transistor and the one end of the input branch of the current mirror circuit.

The current-mode amplifier according to the invention includes a controlled current mirror structure with a pre-charge capacitor. No reference current is required. The transistor count is relatively low. The structural layout of the amplifier requires no symmetry. The amplifier has no high gain feedback loop or any sensitive node. Therefore, it is less susceptible to noise or manufacture process variations. The current-mode sense amplifier according to the invention determines a logic state based on its input current information. The input data is either the state of a current flow or the state of no current flow representing a digital logic value.

Other features which are considered as characteristic for the invention are set forth in the appended claims.

Although the invention is illustrated and described herein as embodied in a current mode sense amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
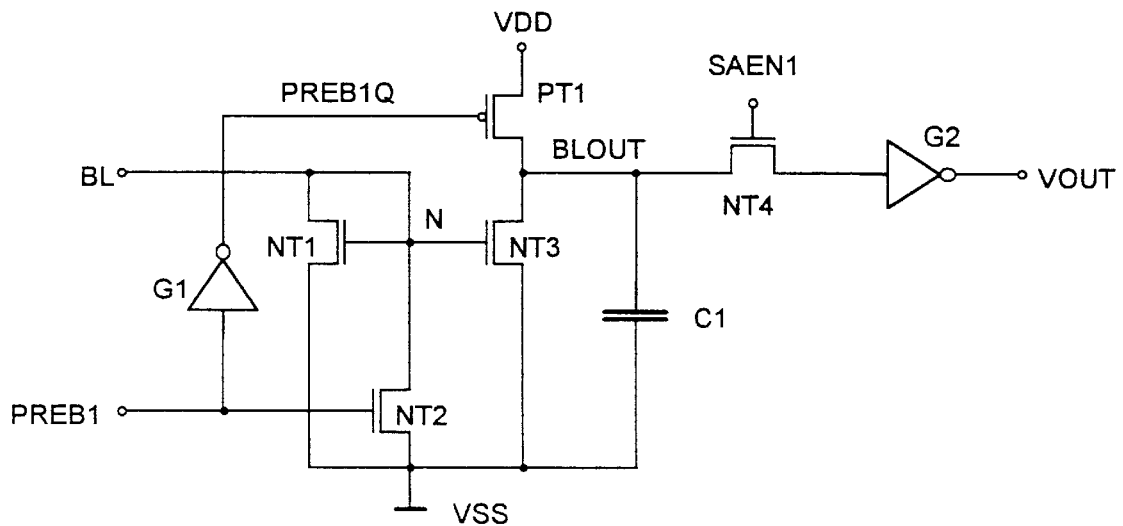
FIG. 1 is a schematic circuit diagram of a first embodiment of the invention.

Referring now to the figures of the drawings in detail and first, particularly, to FIG. 1 thereof, there is seen a current-mode sense amplifier which includes four n-channelenhancement-type-transistors (NMOS), one p-channel-MOS-transistor and an inverter including two complementary MOS-transistors.

A bulk voltage of the PMOS-transistor is connected to a positive power supply VDD and a bulk voltage of the NMOS-transistors is connected to a negative supply voltage (e.g. −2.0 Volt) or is connected to ground potential VSS depending on the technology. An amplifier includes a current mirror circuit having current mirror transistors NT1, NT3. Gates of the transistors NT1, NT3 are connected to each other forming a node N. Drain and gate electrodes of the transistor NT1 are connected together. Source electrodes of the transistors NT1, NT3 are connected to the terminal for the ground potential VSS. The transistor NT1 forms an input branch of the current mirror circuit and the transistor NT3 forms its output branch. A drain of the transistor NT3 is connected through a PMOS-transistor PT1 to the terminal for the positive supply potential VDD. A node between the transistors NT3 and PT1 is connected to a first electrode of a capacitor C1 carrying a signal BLOUT. A second electrode of the capacitor C1 is connected to the terminal for the ground potential VSS. The gates of the current mirror transistors NT1, NT3 are connected through a drain-source path of an NMOS-transistor NT2 to the terminal for the ground potential. Gates of the transistors NT2, PT1 are controlled by a precharge control signal PREB1. The NMOS-transistor NT2 is directly controlled by the signal PREB1 and the PMOS-transistor PT1 is controlled by an inverted signal PREB1Q. The signal PREB1Q is generated from the signal PREB1 through an inverter G1. The input branch of the current mirror circuit is connected to an input terminal for inputting a signal BL to be current sensed. Thus, a connection node between the drain and gate electrodes of the transistor NT1 is connected to a bitline of the memory array.

The first terminal of the capacitor C1 which is connected to the node between the transistors PT1, NT3 is connected through a gating device to another amplifier circuit forming an output signal of the current-mode sense amplifier. The gating device is a pass transistor NT4 being controlled by a read signal SAEN1. The other amplifier circuit providing pulse shaping is a CMOS-inverter G2. The input signal BL is sensed and amplified and provided as an output signal VOUT at an output of the inverter G2.

The basic operation of the sense amplifier in FIG. 1 is as follows. When the precharge signal PREB1 is active during a precharge phase, the capacitor C1 is being charged. After the precharge phase, the signal PREBQ1 is inactive and the bitline signal BL is provided from a memory cell. In a first state the bitline signal BL is a current into the amplifier representing a logic state "0" and in a second state it is no current representing a logic state "1". The capacitor C1 is discharged or maintains its charge depending on the signal BL. Then, the read out enable signal SAEN1 is activated for providing the charge state of the capacitor C1 to the pulse forming inverter G2 having the output which provides the output signal VOUT.

In detail, the amplifier shown in FIG. 1 operates as follows. During the precharge phase the control signal PREB1 is "1" and the control signal SAEN1 is "0". The control transistor NT2 is turned on connecting the gates of the transistors NT1, NT3 (at the node N) to the ground potential VSS and thereby setting the node N to logic "0".

The signal PREB1Q is "0" turning on the transistor PT1. Therefore, current flows from the supply terminal for the positive supply potential VDD into the capacitor C1 charging the capacitor C1. The transistors NT1, NT3 are turned off since the node N is logic "0". When the capacitor C1 is charged, the signal BLOUT is at the potential VDD which is logic "1".

A sensing and discharging phase is as follows. After the capacitor C1 is fully charged, the precharge signal PREB1 goes from "1" to "0". The node N is isolated from the ground potential VSS and becomes floating. The control transistors PT1 and NT2 are turned off. The current information from the input signal BL at the node N is then sensed by the current mirror circuit. Different logic states are reflected by monitoring, whether or not there is any drop of a voltage level of the signal BLOUT from the potential VDD to the potential VSS.

With the memory data being logic "0" the input signal BL inputs a current from the memory cell. This induces the node N which raises its voltage level from the potential VSS to a threshold voltage of the transistor NT3. Once the threshold voltage is reached, both of the transistors NT1 and NT3 are turned on, with the current mirror circuit beginning to conduct current. The current from the memory cell flowing through the input branch of the current mirror circuit through the transistor NT1 is mirrored into the output branch flowing through the transistor NT3. Since the transistor PT1 is turned off, the current through transistor NT3 is actually provided from the capacitor C1. The capacitor C1 is discharged and the signal BLOUT falls from the potential VDD to the potential VSS, from logic "1" to logic "0".

With the memory data being logic "1" there is no current flowing out of the memory cell. The node N remains floating. The transistors NT1, NT3 remain turned off and the current mirror branches conduct no current. There is no current path, e.g. through the transistor NT3, that would discharge the capacitor C1. Thus, the signal BLOUT is maintained at the potential VDD which is logic "1".

The operation during a latching phase is as follows. After the sensing and discharging, the logical state of the signal BLOUT is stable at logic "0" or logic "1". The read signal SAEN1 is activated and goes from logic "0" to logic "1". The pass transistor NT4 is turned on and the signal BLOUT is passed to the inverter G2. The inverter G2 inverts the logic state of the signal BLOUT and outputs the signal VOUT.

Figure 2:
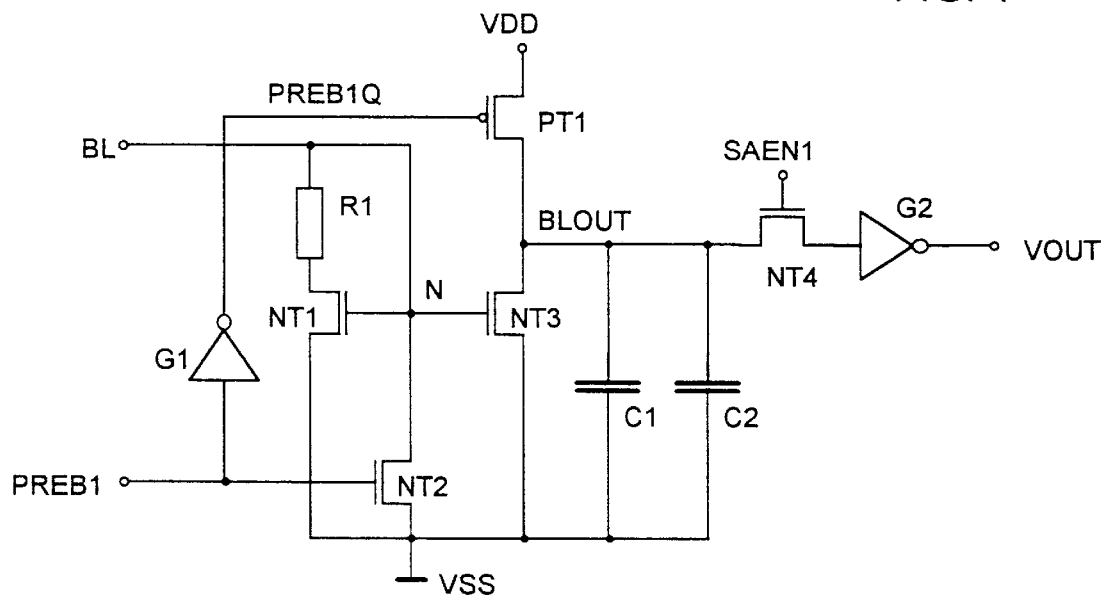
FIG. 2 is a schematic circuit diagram of a second embodiment of the invention.

In the other preferred embodiment according to FIG. 2, there are two split capacitors C1, C2. One of the capacitors may be switched off or deactivated when the circuit structure has propagation time constraints. With one of the capacitors switched off the sense amplifier works faster as the RC-time constant is smaller. Switching off is usually performed during a testing process after manufacture. Additionally, there is an ohmic resistor R1 connected between the bitline input and the drain of the transistor NT1. The discharge time of the capacitors C1, C2 is controllable by adjusting the resistance of the ohmic resistor R1.

The current-mode sense amplifier according to the invention is preferably applicable for current sensing the bitline signal provided during reading from memory cells. The amplifier is preferably applicable for read only memories (ROM). Since the amplifier has a low transistor count and covers a small chip area, it does not require any layout symmetry considerations, it is less susceptible to signal noise and it is especially suitable for embedded ROMs that are part of a larger chip containing further logic and analog circuitry. However, the amplifier may also be used in other fields where current sensing has to be performed, e.g. in analog-digital conversion circuits or comparator circuits.

We claim:

1. A current amplifier, comprising:

a terminal for an input signal to be current amplified;

first and second supply terminals;

a current mirror circuit having an input branch with two ends, an output branch with two ends and a connection node between said branches;

one of said ends of said input branch connected to said input signal terminal;

another of said ends of said input branch connected to said first supply terminal;

a first control transistor connected between one of said ends of said output branch and said second supply terminal;

a capacitive device connected to said one end of said output branch;

another of said ends of said output branch connected to said first supply terminal; and a second control transistor connected between said connection node and said first supply terminal;

said first and second control transistors controlled by a control signal for precharching said capacitive device prior to application of the input signal, said control signal applied inverted to said first control transistor and non-inverted to said second control transistor.

2. The current amplifier according to claim 1, wherein said capacitive device is connected between said one end of said output branch of said current mirror circuit and said first supply terminal.

3. The current amplifier according to claim 2, including another connection node between said one end of said output branch of said current mirror circuit and said capacitive device, a gating device connected to said other connection node, and another amplifier device connected to said gating device.

4. The current amplifier according to claim 3, wherein said gating device is a path transistor and said other amplifier device is an inverter.

5. The current amplifier according to claim 1, including another transistor having a drain-source path, and an ohmic resistor, said input branch of said current mirror circuit having the drain-source path of said other transistor and said ohmic resistor, and said ohmic resistor connected between said drain-source path of said other transistor and said one end of said input branch of said current mirror circuit.

* * * * *